United States Patent [19]

Matsumoto et al.

[11] Patent Number: 5,019,419
[45] Date of Patent: May 28, 1991

[54] PROCESS FOR PRODUCING AN ELECTRONIC PART

[75] Inventors: Yasuji Matsumoto; Maya Moriyama; Yasushi Kuwahara, all of Gunma, Japan

[73] Assignee: Toshiba Silicone Co. Ltd., Tokyo, Japan

[21] Appl. No.: 442,759

[22] Filed: Nov. 29, 1989

[30] Foreign Application Priority Data

Nov. 30, 1988 [JP] Japan ................... 63-302703

[51] Int. Cl.$^5$ ............................................. B05D 5/12
[52] U.S. Cl. ...................................... 427/96; 427/377; 427/387; 427/407.1
[58] Field of Search ................. 427/96, 116, 117, 118, 427/407.1, 377, 387

[56] References Cited

U.S. PATENT DOCUMENTS

| 4,163,072 | 7/1979 | Soos | 427/407.1 |
| 4,539,232 | 9/1985 | Burzynski et al. | 427/407.1 |
| 4,618,389 | 10/1986 | Agodoa | 427/407.1 |

Primary Examiner—Michael Lusignan
Attorney, Agent, or Firm—Sughrue, Mion, Zinn, Macpeak & Seas

[57] ABSTRACT

A process for producing an electronic part which comprises: coating a predetermined surface of the electronic part with a composition comprising as basic ingredients 100 parts by weight of a polyorganosiloxane having an alkenyl group, 0.01 to 10 parts by weight of an organic peroxide and 0.01 to 20 parts by weight of an adhesion promoter, thereby to form a layer of the composition adhered to the predetermined surface of the electronic part; subjecting said electronic part having adhered thereto the composition layer to heat treatment, thereby to convert said composition layer into a layer of a cured elastomer having surface tackiness; and forming a protective sealing resin layer on the cured elastomer layer having surface tackiness.

15 Claims, 1 Drawing Sheet

FIGURE
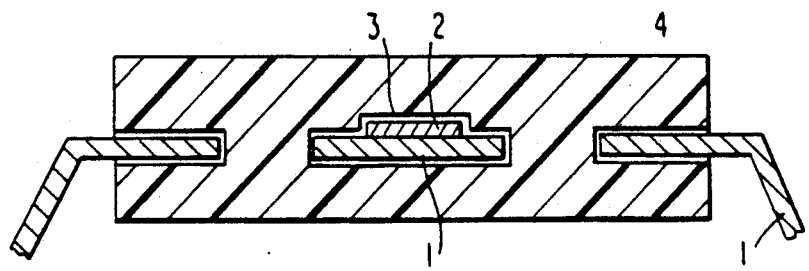

PROCESS FOR PRODUCING AN ELECTRONIC PART

FIELD OF THE INVENTION

This invention relates to a process for producing an electronic part, and in particular it relates to a process for producing an electronic part sealed with a resin-type protective sealing material, having excellent moisture resistance and other properties.

BACKGROUND OF THE INVENTION

Electronic parts such as an IC memory element are sealed with a metal cap or a ceramic shell or sealed with a protective sealing material of organic resin, etc., by molding in order to increase it's reliability. Of such conventional methods, a technique of sealing electronic parts with an epoxy resin or other resin through molding or coating attracts attention from the standpoints of its good workability (production efficiency) and low cost, and is being put in practical use. However, when electronic parts sealed with an epoxy resin through molding or coating are subjected to heat cycle tests, since the epoxy resin generally has a high modulus of elasticity, the epoxy resin tends to give stress to the electronic parts so that the electronic parts often suffer damage or change in performance. For this reason, in sealing electronic parts with an epoxy resin or other resin through molding or coating, a method is employed in which a predetermined surface of an electronic part is first covered with a layer of a silicone rubber or silicone gel as a primary protective material, and this primary protective material layer is then covered with an epoxy resin or other resin through molding, etc. Particularly, since the silicone gel has a low modulus of elasticity and shows good adhesion to an epoxy resin or other resins due to its surface tackiness, silicone gel is often used as such a primary protective material for sealing minute electronic parts through molding.

As described above, the silicone gel has good tackiness and follow-up properties as compared with the silicone rubber and, hence, is suitable for use as a primary protective material. However, the silicone gel is so low in dielectric breakdown voltage that such is defective in insulating properties. To overcome such a problem, a method is employed in which a filler such as a silica powder is added to the above-described silicone gel. This method, however, is disadvantageous in that not only are the tackiness and follow-up properties inherently possessed by the silicone gel impaired, but also the pourability of the resulting silicone gel composition becomes poor to impair its workability, due to the sedimentation of the filler or viscosity increase before gelation or curing.

Another method is employed in which before a layer of the silicone gel is formed on an electronic part, a layer of a silicone rubber is formed beforehand as a primer layer. However, this method has a disadvantage in that the process necessarily includes a multi-stage molding operation and is complicated, although dielectric strength can be improved.

SUMMARY OF THE INVENTION

This invention has been made in view of the above-described problems accompanying the prior art methods.

Accordingly, an object of the present invention is to provide a process for producing an electronic part.

The process according to this invention can provide a resin-sealed electronic part having excellent moisture resistance and dielectric strength, without the necessity of complicated operations.

BRIEF DESCRIPTION OF THE DRAWING

The Figure is a sectional view illustrating the construction of an electronic part sealed with a molded resin produced by one embodiment of the process of this invention.

DETAILED DESCRIPTION OF THE INVENTION

In accordance with this invention, in producing a resin-sealed electronic part, a predetermined surface of an electronic part is first coated with a composition comprising, as essential ingredients, a polyorganosiloxane having an alkenyl group, an organic peroxide and an adhesion promoter, the resulting electronic part coated with the composition is subjected to heat treatment to form a polyorganosiloxane layer, and the electronic part is sealed by molding with an epoxy resin or other resin through the polyorganosiloxane layer.

As described above, a composition comprising as essential ingredients a polyorganosiloxane having an alkenyl group, an organic peroxide and an adhesion promoter is used according to the invention as a primary coating material for an electronic part. Upon heat treatment, the composition undergoes a crosslinking reaction to give a primary coating layer, which is composed of an inner part of an elastic and non-tacky polymer and a surface part of a tacky polymer. In other words, a primary coating layer composed of a lower layer corresponding to the silicone rubber layer and an upper layer corresponding to the silicone gel layer can be formed through one coating operation and heat treatment. Therefore, in the case where an electronic part coated with such primary coating layer is sealed through the primary coating layer with, for example, an epoxy resin or other resin by molding, the epoxy or other resin can easily adhere to the primary coating layer so that the desired sealing can be attained. Further, since the innermost part of the coating layer, which is in contact with the sealed electronic part, is a rubber layer, not only can stress imposed by the epoxy or other resin constituting the outer coating be relaxed, but also the coating can exhibit excellent dielectric strength.

An embodiment of the process of this invention will be further described in detail below.

First, an electronic part to be sealed through molding, such as a diode element, a transistor element or an IC element, is provided. On the other hand, a composition is provided which comprises, as basic ingredients, (a) 100 parts by weight of a polyorganosiloxane having an alkenyl group, (b) 0.01 to 10 parts by weight of an organic peroxide and (c) 0.01 to 20 parts by weight of an adhesion promoter, and which further comprises, if desired and necessary, (d) 50 parts by weight or less of a polyorganohydrogen siloxane and (e) 20 ppm or less of an addition reaction catalyst. The polyorgano-siloxane-containing composition is coated on a predetermined surface of the electronic part so as to form a layer of the composition having a thickness of, for example, about 0.1 to 1 mm.

The resulting electronic part having adhered thereto the composition layer is subjected to heat treatment at a temperature of about 100° to 200° C. for about 2 to 60 minutes. Upon this heat treatment, the polyorganosiloxane-containing composition layer undergoes a cross-linking reaction to charge into a cured layer having a tacky surface layer and an inner layer of a cured elastomer (rubber). The resulting cured elastomer layer having surface tackiness is covered by coating or molding with a protective sealing resin such as an epoxy or urethane resin for use in molding. If desired and necessary, the resulting resin layer is heat-treated for curing. Thus, a desired resin-sealed electronic part is obtained.

The polyorganosiloxane-containing composition particularly used in the process of this invention will be explained below.

Ingredient (a): Polyorganosiloxane Having an Alkenyl Group

Examples of the alkenyl group are a vinyl group and an allyl group. The polyorganosiloxane has at least one alkenyl group of such a kind per molecule, and may be a mixture of one having one alkenyl group per molecule and one having plural alkenyl groups per molecule. The polyorganosiloxane may be of a straight-chain, branched, cyclic or three-dimensional structure, or may be a mixture or copolymer thereof. Further, the polyorganosiloxane may contain organic groups other than the above described alkenyl group, and examples of such other organic groups include an alkyl group (such as methyl, ethyl or propyl), an aryl group (such as phenyl) and a trifluoropropyl group. Of those, methyl and phenyl are generally preferred. However, a trifluoropropyl group is preferred from the standpoint of oil resistance, while a combination of about 95 mol % of methyl and about 5 mol % of phenyl is preferred from the standpoint of low-temperature properties. Examples of the polyorganosiloxane of the above kind are described below.

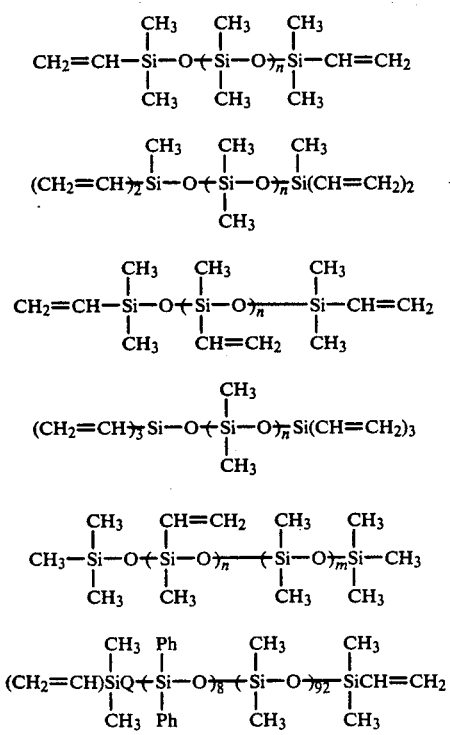

(Ph = a phenyl group)
(m and n = a positive integer)

Examples of the polyorganosiloxane further include a copolymer of 6 mol % of $CH_2=CH(CH_3)SiO$, 54 mol % of $SiO_2$ and 40 mol % of $(CH_3)_3SiO_{\frac{1}{2}}$ and a copolymer of 5 mol % of $CH_2=CH(CH_3)_2SiO_{178}$, 55 mol % of $SiO_2$ and 40 mol % of $(CH_3)_3SiO_{\frac{1}{2}}$.

The polyorganosiloxane selected has a viscosity in the range of from 50 to 200,000 cP (25° C.), preferably from about 100 to 50,000 cP, from the standpoint of the workability of the composition to be prepared and the physical properties of a cured product obtained therefrom.

Ingredient (b): Organic Peroxide

The organic peroxide acts as a free-radical initiator to make the above-described alkenyl group-containing polyorganosiloxane undergo radical crosslinking when an electronic part coated with the resulting composition is subjected to heat treatment for curing. Examples of the organic peroxide are an alkyl-type peroxide such as dicumyl peroxide, di-tert-butyl peroxide, 2,5-dimethyl-2,5-di-tert-butyl-peroxyhexane or 1,1-bis(tert-butyl-peroxy)-3,3,5-trimethylcyclohexane, and benzoyl peroxide. Of those, the alkyl-type peroxides are particularly preferred because decomposition products generated therefrom do not show corrosive properties. The amount of the organic peroxide added to the composition is from 0.01 to 10 parts by weight, preferably from 0.5 to 4.0 parts by weight, per 100 parts by weight of the polyorganosiloxane having an alkenyl group.

Ingredient (c): Adhesion Promoter

Examples of the adhesion promoter are a silane coupling agent, and an adhesion promoter which is used to impart adhesive properties to addition-type silicone rubbers. Examples of the silane coupling agent include vinyltrimethoxysilane, vinyltriethoxysilane, vinyltris(-methoxyethoxy)silane, 3-aminopropyltrimethoxysilane, 3-aminopropyltriethoxysilane, N-(2-aminoethyl)-3-aminopropyltrimethoxysilane, N-(2-aminoethyl)-3-aminopropylmethyldimethoxysilane, N,N-dimethyl-3-aminopropyltrimethoxysilane, N-phenyl-3aminopropyltrimethoxysilane, 3-chloropropyltrimethoxysilane, 3-chloropropylmethyldimethoxysilane, 3chloropropylmethyldiethoxysilane, 3-methacryloxypropyltrimethoxysilane, 3-methacryloxypropylmethyldimethoxysilane, 3-glycidoxypropyltrimethoxysilane, 3-glycidoxypropylmethyldimethoxysilane, 3-(1,2-oxycyclohexyl)propyltrimethoxysilane, 3-(1,2-oxycyclohexyl)propylmethyldimethoxysilane, 3-mercaptopropyltrimethoxysilane, 3-mercaptopropylmethyldimethoxysilane and 3-ureidopropyltrimethoxysilane. Examples of the adhesion promoter which is used to impart adhesive properties to addition-type silicone rubbers include an adduct of a polyorganohydrogensiloxane with methacryloxysilane (JP-B-58-26376), polyorganohydrogensiloxane containing an epoxy or ester group (JP-A 52-39751), polyorganosiloxane containing a methacryloxy group and a vinyl group or a hydrogen group (JP-A-53-118453), and vinyl group-containing amidosiloxane (JP-A-54-146851). (The term "JP-A" and "JP-B" as used herein mean an "unexamined published Japanese patent application" and an "examined Japanese patent publication", respectively.)

These adhesion promoters serve to improve the adhesion of the composition to electronic parts. The amount of the adhesion promoter added to the composition is in the range of from 0.01 to 20 parts by weight per 100 parts by weight of the polyorganosiloxane having an alkenyl group. If the amount thereof is less than 0.01 part by weight, the resulting composition cannot show sufficient adhesion to electronic parts, while an amount exceeding 20 parts by weight is also disadvantageous in that the hardness of a cured elastomer layer (rubber layer) to be formed from the composition becomes so low that the cured elastomer layer cannot exhibit the desired function. In order to increase the activity of the adhesion promoter, a hydrolysis accelerator or a ring opening catalyst for epoxy groups may appropriately be used in combination with the adhesion promoter.

Examples of the hydrolysis accelerator are amine compounds such as dimethylhexylamine, diethylhydroxylamine and tetramethylguanidine; quaternary ammonium salts such as tetramethylammonium chloride and trimethylhexylammonium chloride; metal salts of organic acids such as zinc octoate, tin octoate, dibutyltin diacetate, dibutyltin dioctoate, dibutyltin dilaurate and dioctyltin dilaurate; and organotitanium compounds such as tetrapropyl titanate, tetrabutyl titanate, dipropoxybis(acetylacetate)titanium, dipropoxybis(ethylacetoacetato)titanium, 1,3-dioxypropanebis-(acetylacetonato)titanium and 1,3-dioxypropanebis(ethylacetonato)titanium. Of the above hydrolysis accelerators, the organotitanium compounds are effective in helping the storage stability of the composition according to this invention, because they have a slow rate of decomposing organic peroxides.

Examples of the ring opening catalyst for epoxy groups include acid anhydrides, amine compounds and metal chelate compounds.

Ingredient (d): Polyorganohydrogensiloxane

This ingredient is added to the composition, if desired and necessary, in order to control the crosslink density and surface tackiness of a cured elastomer (rubber) layer formed from the composition. Examples of the polyorganohydrogensiloxane are the following compounds.

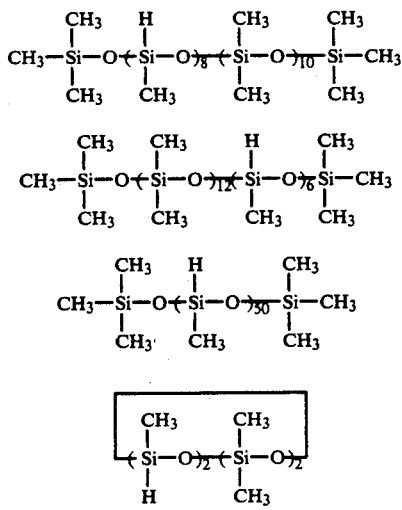

Another example of the ingredient (d) is a copolymer of 60 mol % of H(CH₃)₂SiO₁.₅ and 40 mol % of SiO₂.

The amount of the polyorganohydrogensiloxane added to the composition varies depending upon the kind of the polyorganosiloxane having an alkenyl group, but is generally 50 parts by weight or less, preferably 5 parts by weight or less, per 100 parts by weight of the polyorganosiloxane having an alkenyl group.

Ingredient (e): Addition Reaction Catalyst

This addition reaction catalyst is used, if desired and necessary, in combination with the polyorganohydrogensiloxane, and serves to control the surface tackiness of a cured elastomer layer which is formed. Specifically, the addition reaction catalyst participates in the addition reaction of alkenyl groups of the ingredient (a) with hydrosilyl groups of the ingredient (d). Examples of the addition reaction catalyst are platinum catalysts such as chloroplatinic acid, alcohol-modified chloroplatinic acid, a complex of platinum with an olefin, a complex of platinum with a ketone, a complex of platinum with a vinylsiloxane, platinum supported on alumina or silica, and platinum black; palladium catalysts such as tetrakis(triphenylphosphine)palladium, and a mixture of palladium black and triphenylphosphine; and rhodium catalysts such as tetrakis(triphenylphosphine)rhodium, and a mixture of rhodium black and triphenylphosphine. The amount of the addition reaction catalyst added to the composition is suitably selected from the range of up to 20 ppm in terms of the amount of elemental platinum, palladium or rhodium. An amount exceeding 20 ppm is disadvantageous in that a cured elastomer layer formed from the composition shows no surface tackiness.

According to this invention, a filler, a thixotropic agent or other additives may be added to the polyorganosiloxane-containing composition before the composition is applied as a primary coating material on an electronic part, in order to control the flowability of the composition and improve the dielectric strength of the resulting coating. Examples of the additives suitably added are a reinforcing filler such as fumed silica, precipitated silica or silica aerogel; and a non-reinforcing filler such as diatomaceous earth, pulverized quartz, titanium oxide, aluminum oxide, iron oxide, zinc oxide, calcium carbonate, magnesium carbonate, magnesium silicate or glass powder. These fillers may be used as they are, or may be used after being subjected to treatment with a surface treating agent such as an organochlorosilane, a polydiorganosiloxane or a hexaorganosilazane to impart hydrophobicity to the fillers.

Further, considering the workability, the polyorganosiloxane-containing composition may suitably be diluted with an organic solvent before use. Examples of the organic solvent which may be used for the dilution are hydrocarbon-type solvents such as toluene, xylene, cyclohexane, n-hexane, n-heptane, naphtha, mineral spirit and petroleum benzine; halogenated hydrocarbon-type solvents such as chloroform, carbon tetrachloride, trichloroethylene, perchloroethylene and 1,1,1-trichloroethane; ether-type solvents such as ethyl ether, tetrahydrofuran and ethylene glycol diethyl ether; ester-type solvents such as ethyl acetate, butyl acetate and amyl acetate; ketone-type solvents such as methyl ethyl ketone and methyl isobutyl ketone; and siloxane-type solvents such as hexamethyldisiloxane, octamethylcyclotetrasiloxane and decamethylcyclopentasiloxane.

As described above, according to the process of this invention in which the specific polyorganosiloxane-containing composition is used as a primary coating material in producing electronic parts sealed with a resin or molded resin, a minute resin sealing layer can be easily and surely formed, without giving any stress to the sealed electronic part. Illustratively stated, the primary coating layer or primer layer comprises an elastic and soft inner dense part and shows excellent insulating properties, and on the other hand, serves to relax stress given to the electronic part by the molded resin layer. In addition, the surface of the primary coating layer or primer layer has tackiness so that the layer can exhibit good adhesion to a resin layer formed thereon by molding and, hence, the resulting resin layer coating formed through molding can be closely united with the electronic part.

Therefore, the thus-obtained resin-sealed electronic part exhibits excellent dielectric strength and moisture resistance, and maintains these properties for a long period of time, thereby always showing its functions with high reliability. Furthermore, since the primary coating layer or primer layer which serves the above-described two functions can be formed through one operation, the process of this invention is free from complicated operations.

The present invention will be described in more detail by reference to the following examples, which should not be construed to be limiting the scope of the invention.

EXAMPLE 1

A polyorganosiloxane-containing composition was prepared by mixing 80 parts by weight of an organopolysiloxane having a viscosity as measured at 25° C. of 1,000 cP and in which both ends of the molecule had been blocked with a dimethylvinylsilyl group, 20 parts by weight of a polyorganosiloxane having a viscosity as measured at 25° C. of 4,000 cP and containing 90 mol % of dimethylsiloxane units and 10 mol % of methylvinylsiloxane units and in which both ends of the molecule had been blocked with a trimethylsilyl group, 1.0 part by weight of 3-glycidoxypropyltrimethoxysilane, 1.0 part by weight of 1,1-bis-tert-butyl-peroxy-3,3,5-trimethylcyclohexane, and 1.0 part by weight of the polyorganohydrogensiloxane represented by the formula:

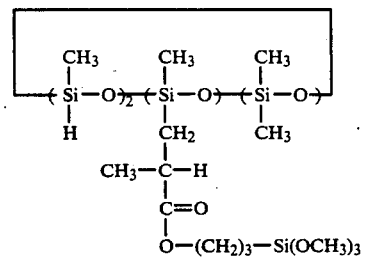

On the other hand, an electronic part composed of a lead frame having mounted thereon a semiconductor chip was provided. The above-prepared polyorganosiloxane-containing composition was applied on part of the lead frame and the surfaces of the semiconductor chip fixed on the frame at a thickness of about 0.5 mm. The resulting electronic part was placed in a hot-air oven at 150° C. for 1 hour to conduct heat treatment of the applied composition, thereby forming a coating layer (primary coating layer) having surface tackiness and whose inner part had been cured into a rubber. The electronic part thus coated with the primary coating layer was sealed with an epoxy resin KE700 (trade name, manufactured by Toshiba Chemical Corporation, Japan) for molding in a manner such that the epoxy resin layer surrounding the electronic part was pressure-molded at 75° C. for 2 minutes, and then post-cured at 175° C. for 8 hours, thereby obtaining an electronic part sealed with the molded resin.

The Figure sectionally illustrates the resin-sealed electronic part as prepared above. In the FIG. 1 is a lead frame, 2 is a semiconductor chip, 3 is a coating layer (silicone layer) having surface tackiness and comprising an inner rubber-like cured part, and 4 is a molded epoxy resin layer.

The above-produced resin-sealed electronic part was evaluated for dielectric strength and moisture resistance and, as a result, the product was found to be good in these properties. Further, the molded epoxy resin layer was cut to examine the state of the resulting cross section, and good adhesion was observed between the silicone layer and the epoxy resin layer. For the sake of comparison, the same procedures as above were repeated except that in place of the above polyorganosiloxane-containing composition, silicone gel TSE3051 (trade name, manufactured by Toshiba Silicone Co., Ltd., Japan) and silicone-type junction coating resin TSJ3150 (trade name, manufactured by Toshiba Silicone Co., Ltd.) each was used. That is, the silicone-type primary coating layers were formed on electronic parts through heat treatment for curing under the same conditions as above, and properties of the resulting primary coating layers were examined. As a result, it was found that the primary coating layer derived from TSE3051 showed tackiness not only at its surface but also at its inner part (the layer was totally gel-like), while the primary coating layer derived from TSJ3150 showed non-tackiness both at its surface and at its inner part (the layer was rubber-like).

Further, the above-obtained electronic parts having respective primary coating layers were sealed with the same epoxy resin through molding under the same conditions as described above, and then the molded epoxy resin layers were cut to examine the states of the resulting cross sections. As a result, it was found that in the former case the silicone gel sufficiently adhered to the epoxy resin, while in the latter case no adhesion was observed between the silicone rubber and the epoxy resin.

EXAMPLE 2

The same polyorganosiloxane-containing composition as used in Example 1 was provided. On the other hand, an electronic part comprising an insulating substrate of glass fiber/epoxy resin and, formed on one side thereof, a comb-shaped electrode having electrode intervals of 0.2 mm was provided. The above polyorganosiloxane-containing composition was coated on the electronic part on the side having the comb-shaped electrode at a thickness of 1 mm. The coating was heat-treated at 150° C. for 2 hours, thereby forming a primary coating layer having surface tackiness and whose inner part was a rubber layer. The dielectric strength of the thus-formed primary coating layer was evaluated, and was found to be 12.3 KV/mm.

For the sake of comparison, the same procedures as above were repeated except that in place of the above polyorganosiloxane-containing composition, silicone gel TSE3051 (trade name, manufactured by Toshiba Silicone Co., Ltd.) and silicone-type junction coating resin TSJ3150 (trade name, manufactured by Toshiba Silicone Co., Ltd.) each was used. That is, silicone-type primary coating layers were separately formed on electronic parts through heat treatment for curing under the same conditions as above, and the dielectric strengths of the resulting primary coating layers were examined. As a result, it was found that the former had a dielectric strength of 8.2 KV/mm and the latter 14.4 KV/mm.

EXAMPLE 3

A polyorganosiloxane-containing composition was prepared by mixing 80 parts by weight of a polyorganosiloxane having a viscosity as measured at 25° C. of 1,000 cP and in which both ends of the molecule had been blocked with a dimethylvinylsilyl group, 20 parts by weight of a polyorganosiloxane having a viscosity as measured at 25° C. of 4,000 cP and containing 90 mol % of dimethylsiloxane units and 10 mol % of methylvinylsiloxane units and in which both ends of the molecule had been blocked with a trimethylsilyl group, 1.0 parts by weight of 3-glycidoxypropyltrimethoxysilane, and 1.0 part by weight of 1,1-bis-tert-butyl-peroxy-3,3,5-trimethylcyclohexane. Using this polyorganosiloxane-containing composition, an electronic part sealed with a molded resin was prepared in the same manner as in Example 1. The thus-produced resin-sealed electronic part was evaluated for the same properties as in Example 1. As a result, the same results as obtained in Example 1 were obtained.

In the above Examples, a semiconductor chip mounted on a lead frame and a comb-shaped electrode were sealed with a molded resin. However, the process of the invention can also be applied to the resin-sealing or molded resin-sealing of various kinds of electronic parts of hybrid structures or other structures such as SIP-type elements, DIP-type elements, diodes, transistors and IC elements. Furthermore, the resin used for sealing or mold-sealing in the invention is not limited to the epoxy resin, and other resins including, for example, polyurethane resins can of course be used in this invention.

While the invention has been described in detail and with reference to specific embodiments thereof, it will be apparent to one skilled in the art that various changes and modifications can be made therein without departing from the spirit and scope thereof.

What is claimed is:

1. A process for producing an electronic part which comprises:

coating a predetermined surface of the electronic part with a composition comprising as basic ingredients 100 parts by weight of a polyorganosiloxane having an alkenyl group, 0.01 to 10 parts by weight of an organic peroxide and 0.01 to 20 parts by weight of an adhesion promoter, thereby to form a layer of the composition adhered to the predetermined surface of the electronic part;

subjecting said electronic part having adhered thereto the composition layer to heat treatment with hot air, thereby to convert said composition layer into a layer of a cured elastomer having a surface tackiness; and forming a protective sealing resin layer on said cured elastomer layer having said surface tackiness.

2. A process as claimed in claim 1, wherein the alkenyl group in the polyorganosiloxane is vinyl group or allyl group.

3. A process as claimed in claim 1, wherein the polyorganosiloxane has an alkyl group, an aryl group or a trifluoropropyl group.

4. A process as claimed in claim 3, wherein the alkyl group is methyl.

5. A process as claimed in claim 3, wherein the aryl group is phenyl.

6. A process as claimed in claim 1, wherein the polyorganosiloxane contains about 95 mol % of methyl and about 5 mol % of phenyl 7. A process as claimed in claim 1, wherein the polyorganosiloxane has a viscosity measured at 25° C. of 50 to 200,000 cP.

8. A process as claimed in claim 7, wherein the viscosity is 100 to 50,000 cP.

9. A process as claimed in claim 1, wherein the organic peroxide is a radical initiator to radical cure the polyorganosiloxane.

10. A process as claimed in claim 9, wherein the initiator is an alkyl peroxide or benzoyl peroxide.

11. A process as claimed in claim 1, wherein the amount of the organic peroxide is 0.5 to 4.0 parts by weight.

12. A process as claimed in claim 1, wherein the adhesion promoter is a silane coupling agent or an adhesion promoter for addition-type silicone rubbers.

13. A process as claimed in claim 1, wherein an hydrolysis accelerator or ring opening catalyst for epoxy groups is used in combination with the adhesion promoter.

14. A process as claimed in claim 1, wherein the composition further comprises 20 ppm or less of an addition reaction catalyst.

15. A process as claimed in claim 1, wherein the composition is diluted with an organic solvent.

* * * * *